(12) United States Patent
Oikawa

(10) Patent No.: US 8,253,421 B2
(45) Date of Patent: Aug. 28, 2012

(54) IMPEDANCE MEASUREMENT METHOD AND IMPEDANCE MEASUREMENT DEVICE

(75) Inventor: Ryuichi Oikawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 415 days.

(21) Appl. No.: 12/654,815

(22) Filed: Jan. 5, 2010

(65) Prior Publication Data

US 2010/0171517 A1 Jul. 8, 2010

(30) Foreign Application Priority Data

Jan. 6, 2009 (JP) ................................. 2009-001188

(51) Int. Cl.
*G01R 31/08* (2006.01)
*G01R 27/08* (2006.01)

(52) U.S. Cl. ........................................ 324/525; 324/713

(58) Field of Classification Search .................. 324/525, 324/713

See application file for complete search history.

(56) References Cited

U.S. PATENT DOCUMENTS

| 6,737,875 | B2 | 5/2004 | Davis et al. |
| 7,292,054 | B2 | 11/2007 | Oikawa |
| 2006/0220663 | A1 | 10/2006 | Oikawa |
| 2009/0234602 | A1* | 9/2009 | Kashiwakura .................. 702/65 |

* cited by examiner

*Primary Examiner* — Amy He
(74) *Attorney, Agent, or Firm* — McGinn IP Law Group, PLLC

(57) ABSTRACT

An impedance measurement method for circuits that has multiple power supply ports and a common ground shared by the multiple power supply ports, that includes finding multiple mutual impedances; finding approximate values for the ground impedance from the multiple mutual impedances; calculating multiple power supply port impedances from the approximate ground impedance values; and generating an equivalent circuit for the applicable circuit based on the ground impedances.

15 Claims, 7 Drawing Sheets

- S101: MEASURE WITH NETWORK ANALYZER
- S102: PERFORM MATRIX CONVERSION
- S110: OBTAIN IMPEDANCE
- S103: RETRIEVE THE MUTUAL IMPEDANCE COMPONENT THAT IS THE MINIMUM WITH THE TARGET FREQUENCY RANGE
- S104: CALCULATE THE GROUND IMPEDANCE AND THE POWER SUPPLY IMPEDANCE
- S105: OUTPUT THE EQUIVALENT CIRCUIT FOR THE CIRCUIT WIRING BOARD

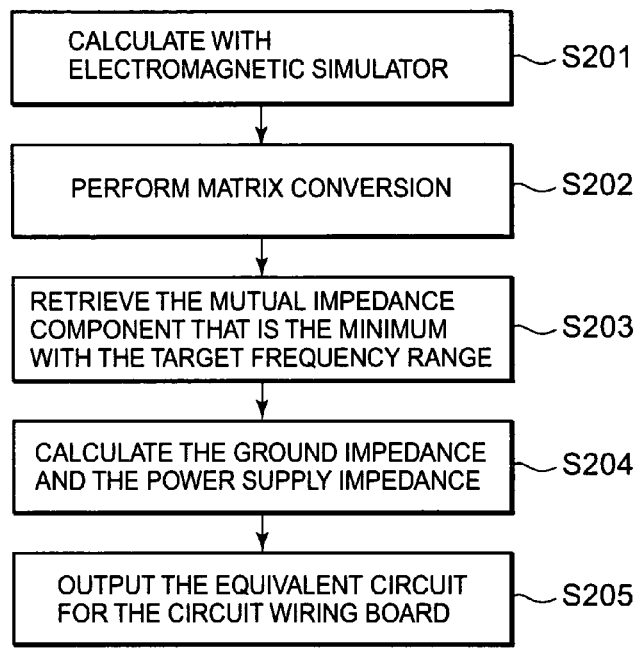
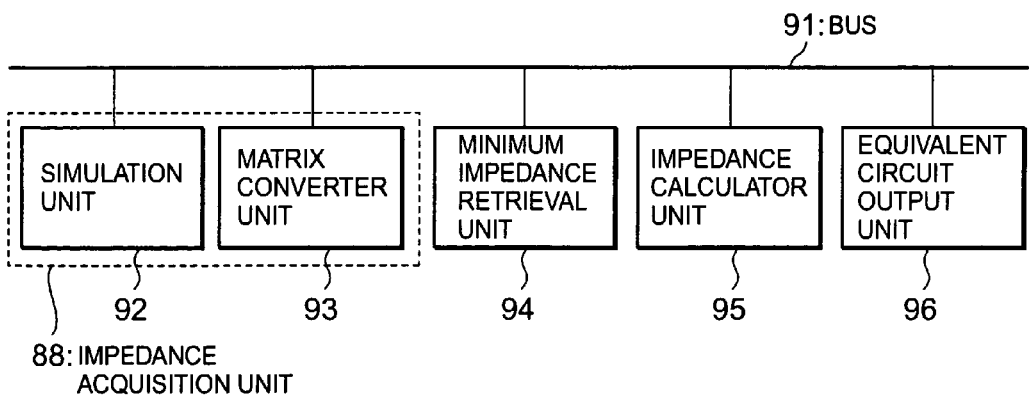

IMPEDANCE MEASUREMENT METHOD AND IMPEDANCE MEASUREMENT DEVICE

BACKGROUND OF THE INVENTION

1. Field of the Invention

The present invention relates to an impedance measurement method, and relates to an impedance measurement device utilizing that impedance measurement method.

2. Description of Related Art

Due to the speed increase in digital circuits, the I/O circuit's switching speed has been becoming faster than ever before, which causes a larger transient current within the circuit. Furthermore, when the multiple transistors in the I/O circuit switch simultaneously, a noticeably large SSN (Simultaneous Switching Noise) is generated that exerts adverse effects on the circuit.

In order to prevent the noise caused by the SSO (Simultaneous Switching Output), the digital circuits, not only the silicon circuit but also package and printed circuit board should be designed to have an appropriate operating margin. Therefore, a highly accurate equivalent circuit must be prepared for each component within the digital circuit, which requires a highly accurate impedance value of the each circuit component.

FIG. 1 explains the impedance measurement method disclosed in JP-A No. 2006-258667. In this measurement method, the S-parameter between the multiple terminals is measured with the multiple RF (Radio Frequency) probes that are connected to a network analyzer. The S-parameter acquired with a network analyzer is then converted into a Z-parameter in order to obtain the impedance of the printed circuit board. In detail, the S-parameter of the power supply terminal 113 on the surface of the circuit wiring board is measured with the ground terminal 308 as the reference, by using RF (Radio Frequency) probe 303 and an RF probe 302 that are connected to a network analyzer. In this case, the necessary impedance to be obtained is the impedance between the ball grid 111 and the power supply terminal 113. However, because of the support board 220, a direct contact with the RF probe 302 to the ball grids 111 is practically impossible.

A method conducting this kind of impedance measurement is described in the U.S. Pat. No. 6,737,875 which discloses a method for measuring the impedance between the two terminals without the need for removing the circuit elements connected to the each terminal.

The present inventor has recognized that: if a direct contact with the RF probe to the measurement terminal is impossible, a support board 220 is utilized that makes the measured value to include the impedance of the support board 220 it self. In general, the measured value includes the unwanted parasitic impedance of the measurement system if RF probe cannot be directly contacted to the terminal. Moreover, in this case, because the power supply impedance and ground impedance in the printed circuit wiring board are not separately measured, the obtained impedance is inaccurate, especially in high-frequency region.

SUMMARY

The impedance measurement method of this invention includes: obtaining a plurality of self-impedances and mutual impedances in a circuit which includes a plurality of power supply ports and a common ground shared by the plurality of the power supply ports; retrieving a minimum value among the plurality of the mutual impedances as an approximate value for an impedance of the common ground; and calculating a plurality of power supply impedances for the power supply ports that does not include the impedance of the common ground based on the approximate value, the plurality of the self-impedances, and the plurality of the mutual impedances.

The impedance measurement device for this invention includes an impedance acquisition unit, a minimum impedance retrieval unit, and an impedance calculation unit. In the impedance acquisition unit, a plurality of self-impedances and a plurality of mutual impedances are acquired in a circuit including a plurality of power supply ports and a common ground shared by the plurality of the power supply ports. In the minimum impedance retrieval unit, an approximate value for an impedance of the common ground at a specified accuracy is found based on the plurality of the mutual impedances. In the impedance calculation unit, a plurality of power supply impedances for the power supply ports that does not include the impedance of the common ground are calculated based on the approximate value for the impedance of the common ground, the plurality of the self-impedances, and the plurality of the mutual impedances.

The impedance measurement device and impedance measurement method of this invention is capable of separately extracting the impedance of the electrical current return path (common ground) from the impedance that implicitly includes the electrical current return path (common ground) obtained by a measurement or an electromagnetic field simulation. Thus the resulting model or an equivalent circuit is to be highly accurate, which improves the accuracy of the whole digital circuit model consisting of silicon, package and board.

BRIEF DESCRIPTION OF THE DRAWINGS

The above and other objects, advantages and features of the present invention will become more apparent from the following description of the certain preferred modes taken in conjunction with the accompanying drawings, in which:

FIG. 10 is a flow chart for describing the impedance measurement method in the second embodiment of this invention;

FIG. 11 is a block diagram for describing an example of the structure of the impedance measurement device serving as a function block cluster in the second embodiment of this invention.

DETAILED DESCRIPTION OF THE PREFERRED EMBODIMENTS

The invention is now described herein with reference to the illustrative embodiments. Those skilled in the art will recognize that many alternative embodiments can be accomplished by utilizing the instruction of the present invention and that the invention is not limited to the embodiments illustrated for explanatory purposes.

The preferred embodiments for implementing the impedance measurement method and the impedance measurement device of this invention are described below, with referring to the appended drawings.

First Embodiment

Figure 4:
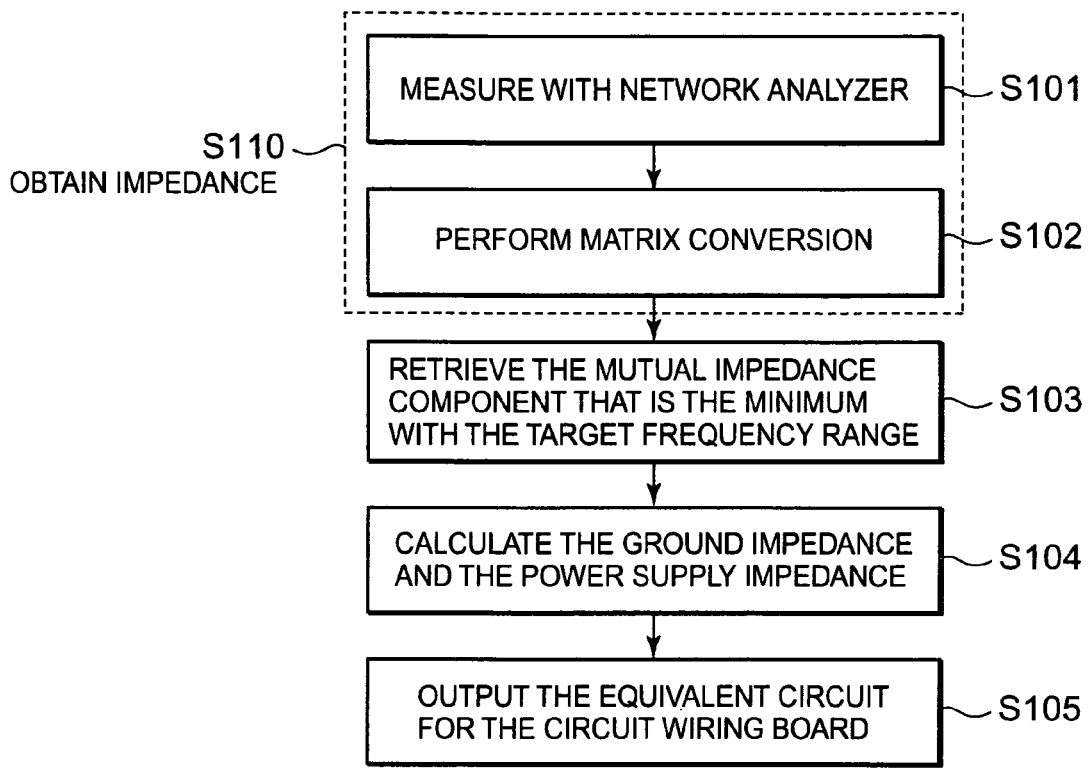
FIG. 4 is a flow chart for describing the impedance measurement method in the first embodiment of this invention.

FIG. 4 is a flow chart for describing the impedance measurement method in the first embodiment of this invention. This flow chart includes step S101, and step S102, and step S103, and step S104, and step S105.

The step S101, step S102, step S103, step S104, and step S105 are executed in that order.

In steps S101 and S102, all of the impedances of the power supply ports in the circuit wiring board are obtained (step S110). The impedances of the power supply ports implicitly include the impedance of the common ground (the ground impedance). This type of impedance is known as a loop impedance. Those obtained loop impedances are comprised of self-impedances and mutual impedances.

In the step S101, a network analyzer, for example, is utilized to measure the S-parameters for all of the power supply ports. There is no particular limit or restriction on this step S101. For example the methods of the prior art may utilized. Therefore, herein, a detailed description is omitted.

In the next step, S102, the loop impedances for all power supply ports are obtained by S-Z matrix conversion. In the step S102, the S-parameter obtained in step S101 is converted into the Z-parameter. More specifically, this matrix conversion may be performed according to the following Equation (1).

$$Z = (I-S)^{-1}(I+S) \quad (1)$$

where, Z, I, and S respectively denote the Z-matrix, the identity matrix, and the S-matrix.

In step S103, the minimum mutual impedance component within the target frequency range is retrieved based on the Z-parameter obtained in step S102.

Figure 5:
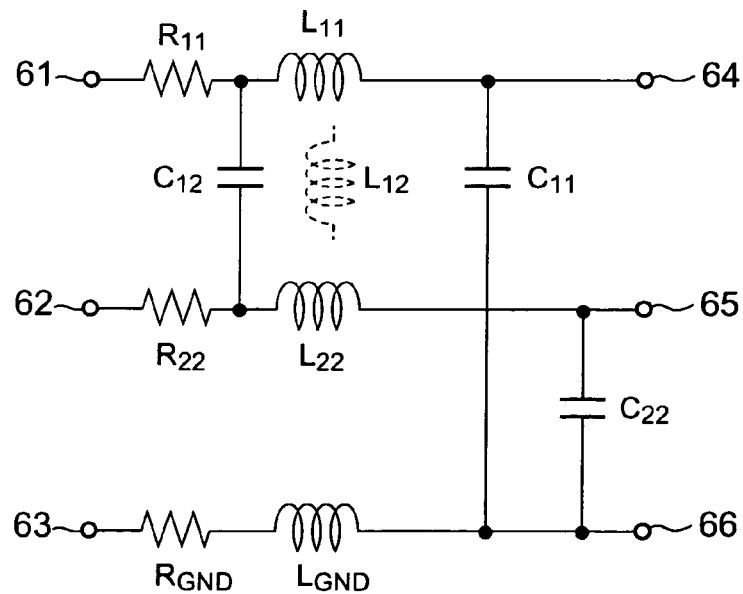
FIG. 5 is a circuit diagram for describing one example of the equivalent circuit for the printed circuit wiring board.

FIG. 5 is a circuit diagram for describing one example of the equivalent circuit for the printed circuit wiring board. This equivalent circuit includes two power supply circuits and one common ground (circuit), and a total of six input/output terminals 61-64.

The first power supply circuit contains a first input/output terminal 61, a resistor R11, an inductor L11, and a fourth input/output terminal 64. The first input/output terminal 61, and a resistor R11, an inductor L11, and a fourth input/output terminal 64 are connected in series in that order within the first power supply circuit.

The second power supply circuit likewise contains a second input/output terminal 62, a resistor R22, an inductor L22, and a fifth input/output terminal 65. The second input/output terminal 62, a resistor R22, an inductor L22, and a fifth input/output terminal 65 are connected in series in that order within the second power supply circuit.

The common ground includes a third input/output terminal 63, a resistor RGND, an inductor LGND, and a sixth input/output terminal 66. The third input/output terminal 63, a resistor RGND, an inductor LGND, and a sixth input/output terminal 66 are connected in series in that order in the common ground (circuit).

A capacitor C12 connects the first power supply circuit to the second power supply circuit. A capacitor C11 connects the first power supply circuit to the common ground. A capacitor C22 connects the second power supply to the common ground. An optional inductor L12 is a mutual inductance between the first power supply inductance L11 and the second power supply inductance L22.

An equivalent circuit for printed circuit board with more than two power supplies is also able to be constructed with the same manner as the circuit shown in FIG. 5.

Figure 6:
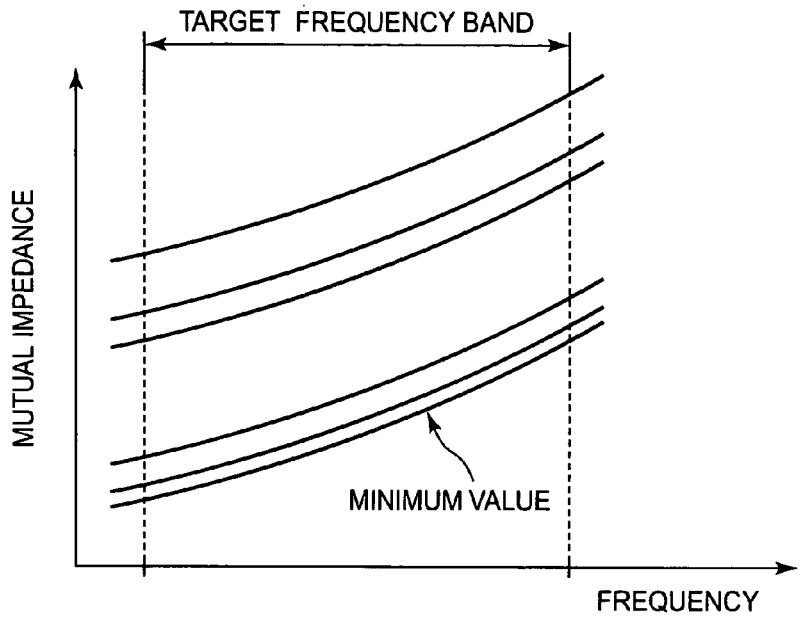
FIG. 6 is a graph for describing an example for measured power supply impedance of a printed circuit wiring board including four power supplies and a common ground shared by those four power supplies.

FIG. 6 shows an example of measured loop impedances of a circuit wiring board with four power supplies and a common common ground shared by the four power supplies. This figure shows six mutual impedance curves for all combination of the four power supplies. The mutual impedances in the loop impedances for the power supplies are denoted as $Z^{Loop}_{12}$, $Z^{Loop}_{13}$, $Z^{Loop}_{14}$, $Z^{Loop}_{23}$, $Z^{Loop}_{24}$ and $Z^{Loop}_{34}$, where $Z^{Loop}_{ij}$ ($i \neq j$) stands for the mutual impedance between the power supply i and the power supply j which implicitly includes the ground impedance $Z^{GND}$. Each impedance curve in FIG. 6 corresponds to the each of the above $Z^{Loop}_{ij}$($i \neq j$).

As shown in FIG. 6, there is a lower limit curve which impedance value takes "minimum".

The minimum curve is able to be found, for example, from the arithmetic means of the impedance values within the target frequency range. The matrix element corresponding to the minimum curve is the minimum impedance component that is used in the later step.

Another preferred way to find out the minimum impedance component is explained by referring FIG. 6 in which all mutual impedance components are compared to each others within the target frequency range. In this method, integral value of the respective curves are calculated. The minimum curve in this case is the curve whose integral value is the smallest in all curves. The integral value is obtained by numerical integration from the lower limit to the upper limit depicted with vertical dashed lines in FIG. 6

In the next step S104, the impedance of the common ground (hereinafter called as the ground impedance), and the impedances for the power supply ports not including the ground impedance are respectively calculated based on the Z-parameter obtained in step S102 and the minimum mutual impedance component obtained in step S103. Hereinafter the impedances for the power supply ports not including the ground impedance are called as power supply impedances.

The principle of the impedance measurement method utilized in this invention is first of all described in detail in order to describe the operation in step S104.

Figure 7:
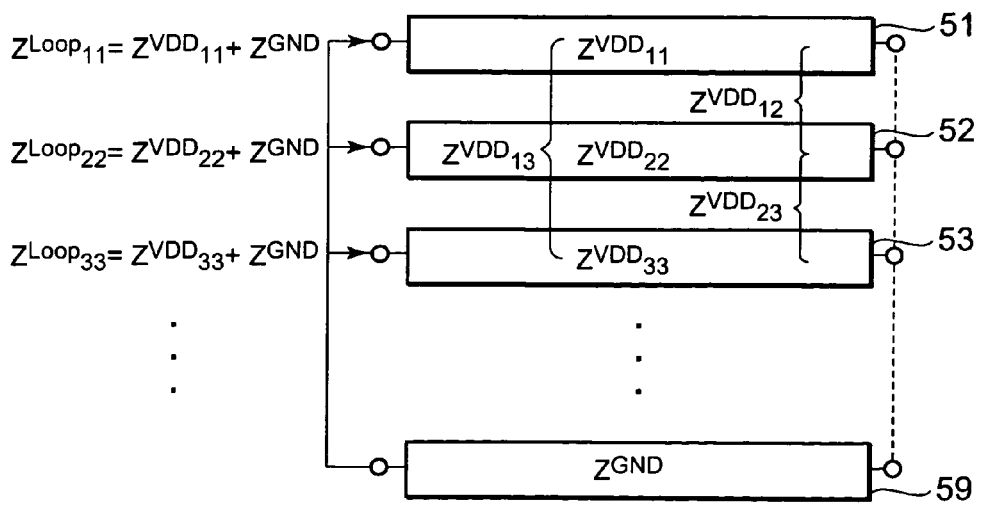
FIG. 7 is a circuit diagram of one example of a circuit wiring board including plural power supplies, and a common electrical current return path (common ground) for these plural power supplies.

FIG. 7 is a circuit diagram showing one example of a circuit wiring board including plural power supplies, and a common electrical current return path (common ground) shared by those plural power supplies. A number from 1 through n is assigned to each of the plural power supplies. The impedance of the power supply is denoted as $Z^{VDD}_{ij}$, where $Z^{VDD}_{ij}$ does not include the ground impedance. The i and j here are respectively integers taking a range from 1-n. The ground impedance is denoted as $Z^{GND}$.

The mutual impedances in the step 103 implicitly include the ground impedance $Z^{GND}$. These mutual impedances are indicated as the loop impedance $Z^{loop}_{ij}$ in FIG. 7.

Both RF probes from the network analyzer are made contact to the terminals (the power supply ports) on the left side of the power supply or common ground as shown in FIG. 7 in order to measure the loop impedance $Z^{loop}_{ij}$. Either the self-impedance $Z^{loop}_{ii}$ or the mutual impedance $Z^{loop}_{ij}$ ($i \neq j$) are obtained depending on which particular terminals (power supply ports) are probed by the RF probe.

The self-impedance $Z^{loop}_{ii}$ is the impedance that corresponds to the electrical current path starting from the terminal (the power supply port) on the left side of the i-th power supply and returning to the common ground terminal on the left side. On the other hand, the mutual impedance $Z^{loop}_{ij}$ ($i \neq j$) is the impedance that corresponds to the electrical current path starting from the terminal (a power supply port) on the left side of the i-th power supply and returning to the terminal (a power supply port) on the left side of the j-th power supply through the common ground.

The following relation can therefore be established among the self-impedance $Z^{loop}_{ii}$, the mutual impedance $Z^{loop}_{ij}$ ($i \neq j$), the power supply impedance $Z^{VDD}_{ij}$, and the ground impedance $Z^{GND}$.

$$Z^{loop}_{ij} = Z^{VDD}_{ij} + Z^{GND} \quad (5)$$

Equation (5) is a set of n-equations with n+1 unknown variables. Therefore, it is not generally able to be solved uniquely. However, if at least one variable is known, Equation (5) reduces into an n-equations of n-variables, thus to be solved uniquely.

The present invention is based on the fact that most actual printed circuit boards/substrates and semiconductor packages have at least one power supply pair whose direct electrical coupling is negligibly small. If the printed circuit board has plural distinct power supplies, it is very common to design the power delivery system so that the electrical interference/coupling between power supplies is minimized. In other words, in a well-designed circuit wiring board, there is at least one power supply pair that meets the following condition.

$$Z^{VDD}_{IJ} \sim 0 \quad (6)$$

where I and J represent the assigned number to the respective power supplies.

Accordingly, $$Z^{loop}_{IJ} = Z^{VDD}_{IJ} + Z^{GND} \sim Z^{GND} \quad (7)$$

is obtained for the different power supplies, I and J ($I \neq J$) whose direct electrical coupling can be ignored. In this way, the ground impedance is found from the measured loop impedance. Now that n+1 unknown variables are reduced into n unknown variables, every variable in Equation (5) is uniquely determined. The power supply impedances and the ground impedance are, thus, obtained separately.

Note that $Z^{loop}_{IJ} = 0$ does not mean power supplies I and J ($I \neq J$) are electrically short-circuited but means that there is no coupling or interference between them.

Even if the direct electrical coupling between power supplies I and J is negligibly small, it does not necessarily mean that mutual impedance $Z^{VDD}_{IJ}$ ($I \neq J$) is exactly 0. Therefore it might be more appropriate to say that an approximate value with the specified accuracy was found for the ground impedance. This specified accuracy is determined by the circuit wiring board design. More specifically, the accuracy is determined by the inter-power supply isolation.

Therefore it is preferable that the circuit wiring board is designed so that the inter-power supply interference or coupling is adequately suppressed for at least one power supply (power supply port) pair.

In step S105, an equivalent circuit for the printed circuit wiring board is generated based on the power supply impedance, and the ground impedance obtained in step S104.

After finding the impedance for each power supply, the R component, L component, and C component for the equivalent circuit is calculated with following equations.

$$R_{ii} = Re(Z_{ii}) |\omega \rightarrow 0 \quad (2)$$

$$L_{ii} = \partial(Im(Z_{ii}))/\partial \omega |\omega \rightarrow 0 \quad (3a)$$

$$L_{i \neq j} = \partial(Im(Z_{ij}))/\partial \omega |\omega \rightarrow 0 \quad (3b)$$

$$K_{i \neq j} = L_{ij}/\sqrt{(L_i L_j)} \quad (3c)$$

$$C_{ii} = \partial(\Sigma_j(Im(Y_{ij})))/\partial \omega |\omega \rightarrow 0 \quad (4a)$$

$$C_{i \neq j} = -\partial(Im(Y_{ij}))/\partial \omega |\omega \rightarrow 0 \quad (4b)$$

There is no particular restriction or limitation on the data format for the equivalent circuit that is to be output. Any previously known format may be employed. Herein, further explanation is provided by using the equivalent circuit illustrated in FIG. 5 as an example.

The equivalent circuit in FIG. 5 is the simplest example. In general, additional equivalent circuit components are added to the circuit in FIG. 5 in order to model the frequency dependent loss, such as skin effect or dielectric loss. However those circuit components are omitted in this example for simplicity.

The impedance measurement method and device of the present invention are also applicable to the case where the S-parameter is measured from both side of input/output terminals without electrically shorting or opening the input/output terminals at the one side as shown in FIG. 7. In this case however, it should be noted that the matrix dimension in Equation (5) is twice of the previous example because there are ports at the both end of the input/output terminals. Additionally Y and Z-matrices are to be converted according to the following Equations (8a) and (8b) prior to applying Equations (2) through (5).

$$Y'_{ij} = Y_{ij} + Y_{i'j} + Y_{ij'} + Y_{i'j'} \quad (8a)$$

$$Z'_{ij} = Z_{ij} - Z_{i'j} + Y_{ij'} - Z_{i'j'} \quad (8b)$$

The i and j are integers within the range of 1 through N/2, respectively. The input/output terminal i' is located at the opposite side of the input/output terminal i. N is the dimension of the Y and Z-matries and the dimension after converted into Y' and Z' is N/2.

In some rare case, it is possible that printed circuit board does not have a single ground but has separate plural grounds. This invention is also applicable even in this case if the appropriate condition is satisfied. In other words, if the plural separate grounds share the same common power supply, the equivalent circuit is obtained with exactly the same manner as already described, by simply exchanging the role of power and ground.

The device that performs the impedance measurement method in this embodiment, namely, the impedance measurement device of this embodiment is described hereafter in the following sections.

The step S101 should preferably be executed with a network analyzer. A calculating device such as a computer is preferably utilized in steps S102-S105. The impedance measurement device of this invention therefore preferably includes a calculating device such as a computer, as well as a network analyzer. However, there is no restriction for the configuration of the impedance measurement device of the present invention as long as the device offer the same functions. Other configuration of the same function may be utilized.

Figure 8:
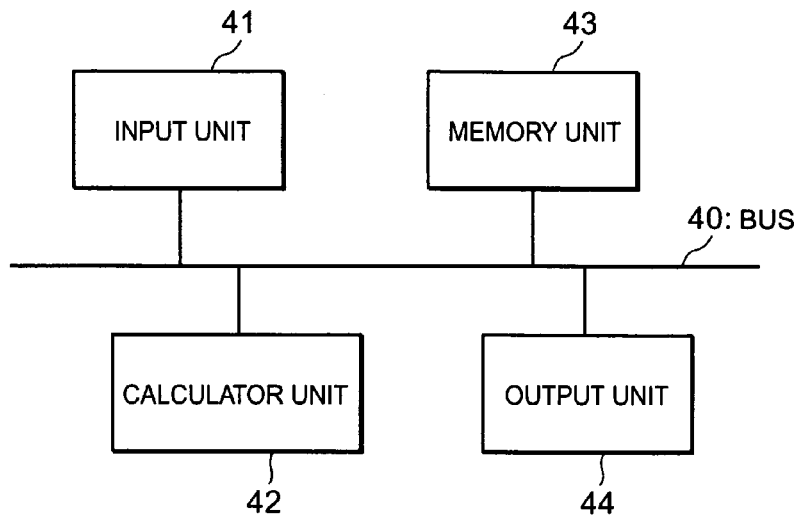
FIG. 8 is a block diagram for an overall description of an example of the structure of the calculator unit in this invention.

FIG. 8 is the block diagram which describes an example structure of the calculator device in this invention. This calculating device includes a bus 40, an input unit 41, a processing unit 42, a memory unit 43, and an output unit 44.

The bus 40 is connected to the input unit 41, the processing unit 42, the memory unit 43, and the output unit 44.

The bus 40 transfers data from or to the input unit 41, the processing unit 42, the memory unit 43, and the output unit 44. The input unit 41 inputs data at the step 102 from the external device, in particular, from a network analyzer. The processing unit 42 performs the respective calculations in steps S102-S105. The memory unit 43 stores the data from the input unit 41 and the results calculated by the processing unit 42. The output unit 44 outputs data to the outside of the device, in particular at the steps such as S105.

Figure 9:
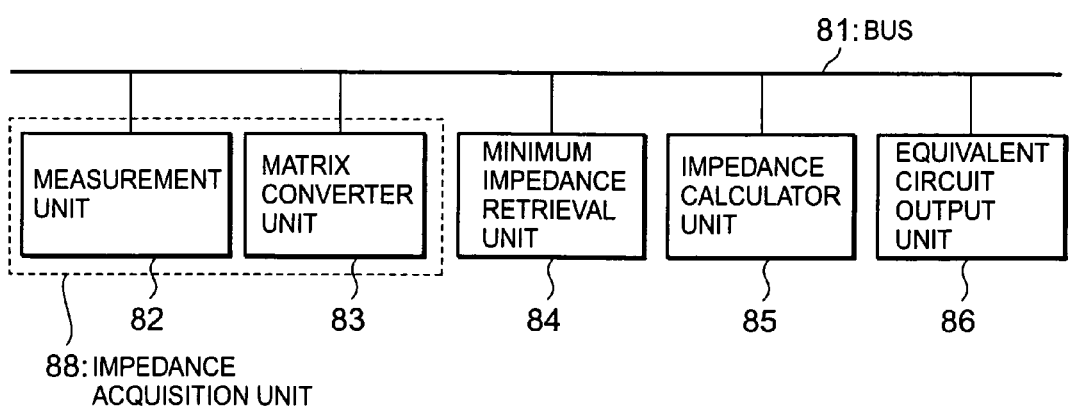
FIG. 9 is a block diagram for describing an example of the structure of the impedance measurement device serving as a function block cluster in the first embodiment of this invention.

FIG. 9 is a block diagram that describes an example of the functional block structure of the impedance measurement device of the present embodiment.
The impedance measurement device in this embodiment includes a bus 81, an impedance acquisition unit 88 (including a measurement unit 82 and a matrix conversion unit 83), a minimum impedance retrieval unit 84, an impedance calculator unit 85, and an equivalent circuit output unit 86.

The measurement unit 82, the matrix conversion unit 83, the minimum impedance retrieval unit 84, the impedance calculator unit 85, and the equivalent circuit output unit 86 are connected to the bus 81.

The measurement unit 82 implements the step S101 and may contain, for example, a network analyzer. The matrix conversion unit 83 implements the step S102. The minimum retrieval unit 84 implements the step S103. The impedance calculator unit 85 implements the step S104. The equivalent circuit output unit 86 implements the step S105.

The bus 81 corresponds to the bus 40. The measurement unit 82, the matrix conversion unit 83, the minimum impedance retrieval unit 84, the impedance calculator unit 85, and the equivalent circuit output unit 86 may respectively consist of combinations with the input unit 41, the processing unit 42, the memory unit 43, and the output unit 44.

Second Embodiment

The impedance measurement method of the second embodiment of this invention is described next. In the first embodiment, the circuit wiring board impedance are retrieved from the actual measurement with a measurement device such as a network analyzer. In the second embodiment, the circuit wiring board impedance is obtained from the simulation with an electromagnetic (EM) field simulator. All other respects of this embodiment are the same as the first embodiment.

FIG. 10 is a flow chart for describing the impedance measurement method in the second embodiment of this invention. This flow chart contains: step S201, step S202, step S203, step S204, and step S205.

Step S201, step S202, step S203, step S204, and step S205 are executed in that stated order.

In steps S201 and S202, all of the loop impedances of the power supply ports in the circuit wiring board are obtained. The loop impedances of the power supply ports implicitly include the ground impedance.

In step S201, S-parameters for all of the power supply ports of the circuit wiring board are, first of all, found by the electromagnetic field simulation or other modeling methods such as PEEC (partial element equivalent circuit). There is no particular limit or restriction on this step S201 and methods of the related known art may be applied, so a detailed description is omitted in this explanation.

Next steps S202-S205 are essentially the same as the steps S102-S105 of the first embodiment, thus detailed description is omitted.

The device of this embodiment for implementing the impedance measurement method is herein described. Namely, a description of the impedance measurement device of this embodiment is given as follows.

Step S201 is preferably executed by utilizing an electromagnetic field simulator, etc. The steps S202-S205 are essentially the same as the steps S102-S105 of the first embodiment so a calculating device such as a computer is preferably utilized in the same way.

An example of the structure of the impedance measurement device of the present embodiment is the same as that described in the first embodiment shown in FIG. 5. The input unit 41 inputs data in particular in step S202 from outside, in particular from the electromagnetic field simulator. All other elements of the structure are identical to the first embodiment so a detailed description is omitted.

FIG. 11 is a block diagram that describes an example of the functional block structure of the impedance measurement device of this embodiment. The impedance measurement device of this embodiment includes: a bus 91, a impedance acquisition unit 88 (a measurement unit 92 and a matrix conversion unit 93), a minimum impedance retrieval unit 94, an impedance calculation unit 95, and an equivalent circuit output unit 96.

The measurement unit 92 executes the step S201 and may, for example, include an electromagnetic field simulator. The bus 91, matrix conversion unit 93, minimum impedance retrieval unit 94, impedance calculation unit 95, and equivalent circuit output unit 96, respectively correspond to the bus 81, matrix converter unit 83, minimum impedance retrieval unit 84, impedance calculator unit 85, and equivalent circuit output unit 86, thus a detailed description is omitted.

COMPARATIVE EXAMPLES

The advantages of the invention is described by employing comparative examples to this invention.

Figure 1:
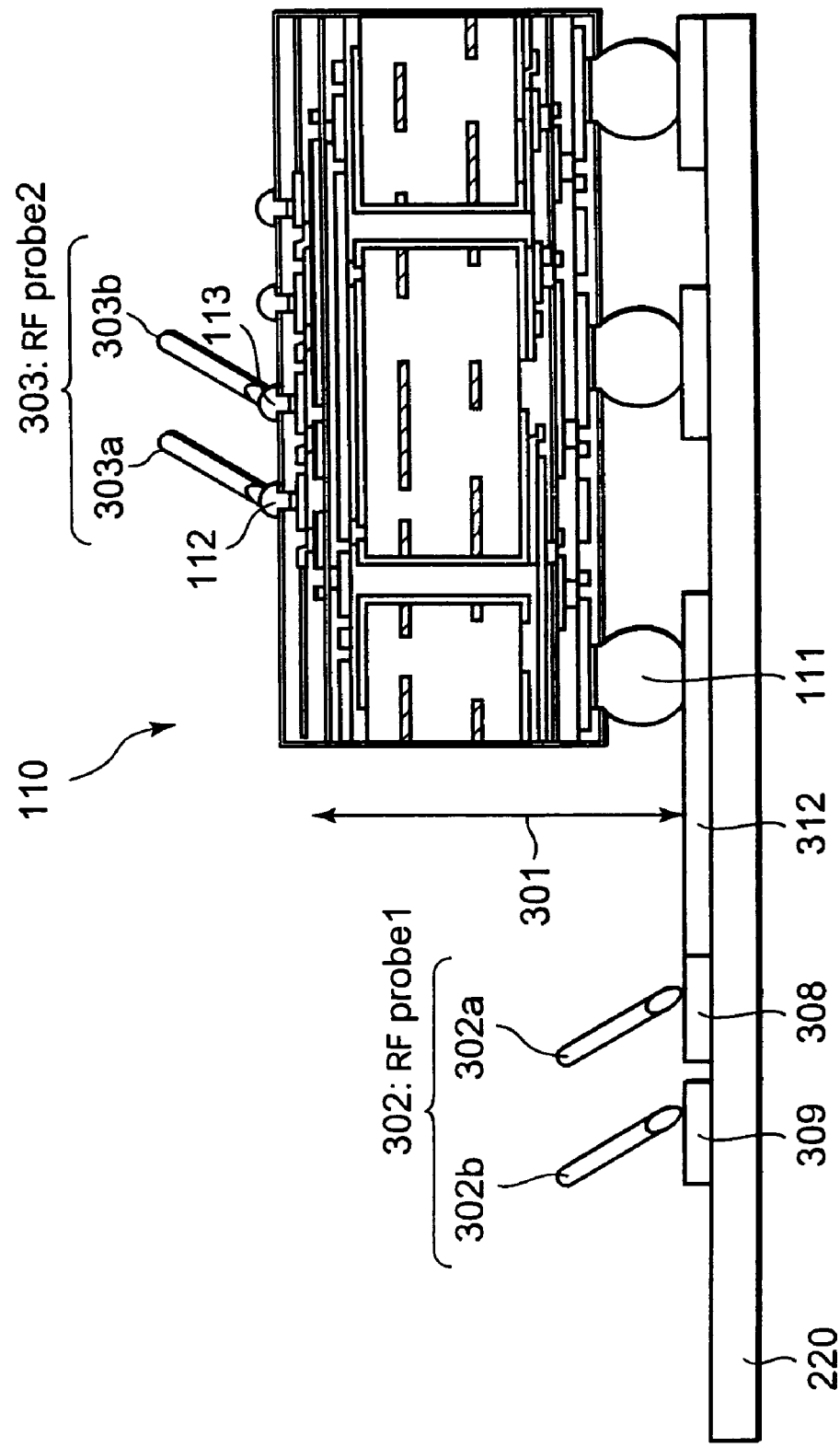
FIG. 1 is a conceptual diagram for describing the method for measuring impedance on the circuit wiring board in the prior art.
Figure 2:
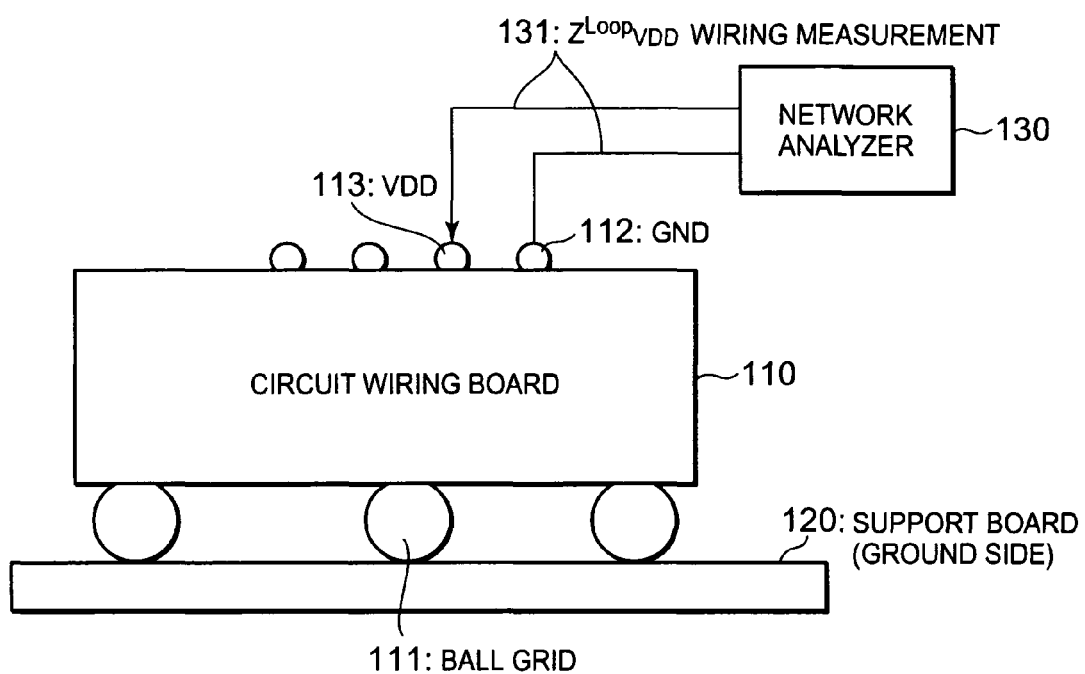
FIG. 2 is a conceptual diagram for describing the method for measuring impedance on the circuit wiring board serving as the first comparative example.

FIG. 2 is a conceptual diagram for describing the impedance measurement method on a circuit wiring board in the first comparative example. This impedance measurement method utilizes a network analyzer and RF (Radio Frequency) probe. A circuit wiring board such as a printed circuit wiring board or semiconductor package substrate is, first of all, mounted on a support board that supports this circuit wiring board or substrate. In the second step, the well calibrated RF probe's signal sensing terminal is made contact to the power supply terminal on the circuit wiring board. The RF probe's ground terminal is, in the same way, made contact to the circuit wiring board' s ground terminal.

The S-parameter of the circuit wiring board is measured with the network analyzer while the RF probe's terminals stay contacted. The acquired S-parameter is then converted to a Y-parameter and a Z-parameter.

Although this impedance measurement method is capable of obtaining the impedance with high accuracy up to high frequency region, the ground impedance is implicitly and inseparably included in the power supply impedance.

Figure 3:
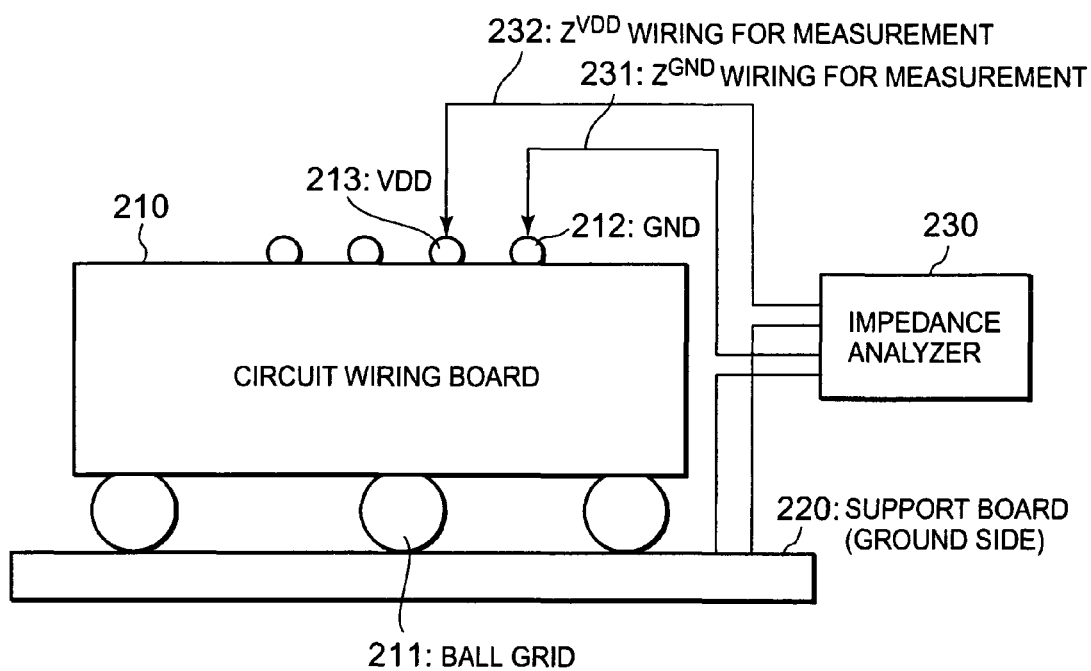
FIG. 3 is a conceptual diagram for describing the impedance measurement method for the circuit wiring board serving as the second comparative example.

FIG. 3 is a conceptual diagram for describing the impedance measurement method on a circuit wiring board in the second comparative example. This method separately measures the power supply impedance and the ground impedance using an impedance analyzer. A circuit wiring board such as a printed circuit wiring board or semiconductor package substrate is, first of all, mounted on a support board that supports this circuit wiring board or substrate. The cathode terminal on the impedance analyzer is next attached to the ground side of the support board. The anode terminal on the impedance analyzer is, in the same way, made contact to the power supply terminal or the ground terminal on the circuit wiring board.

The power and ground impedances are measured respectively between the anode and cathode terminals with keeping the anode and cathode terminals contacted as described above. In this measurement method, an additional ground is necessary on the support board other than a ground on the circuit wiring board. This method is capable of separately measuring the ground impedance, and the power supply impedance on the circuit wiring board.

However, because the distance from the anode terminal to the cathode terminal through impedance analyzer is too long, the parasitic impedance of this path is included in the measured values. This parasitic impedance becomes larger as frequency. Therefore, the impedance can not accurately be measured up to high frequency region.

Considering the first and second comparative examples, the measured values include parasitic impedance from the measurement system, or external ground is employed that is difficult to be calibrated or corrected. In either case, because the ground impedance and power supply impedance on the circuit wiring board are not measured separately, an accurate measurement cannot be made especially up to RF (high) frequency.

The present invention on the other hand, is capable of isolating and extracting the electrical current return path (common ground) impedance from impedances including the electrical current return path (common ground) obtained from measurements or electromagnetic field analysis. The resulting acquired model or equivalent circuit therefore has better accuracy. Consequently, the design accuracy of the circuit wiring boards such as semiconductor packages or system boards are improved
by using this model or equivalent circuit, which yields better product quality.

It is apparent that the present invention is not limited to the above embodiments and that the embodiments can be modified and changed as appropriately within the scope of the technical concept of the present invention.

What is claimed is:

1. An impedance measurement method comprising:
obtaining a plurality of self-impedances and a plurality of mutual impedances in a circuit including a plurality of power supply ports and a common ground shared by the plurality of the power supply ports;
retrieving a minimum value among the plurality of the mutual impedances as an approximation value for an impedance of the common ground; and
calculating a plurality of power supply impedances for the power supply ports not including the impedance of the common ground, based on the approximate value for the impedance of the common ground, the plurality of the self-impedances, and the plurality of the mutual impedances.

2. The impedance measurement method according to claim 1,
wherein, in the calculating a plurality of power supply impedances, each of the power supply impedances for the power supply ports not including the impedance of the common ground is calculated by subtracting the approximate value for the impedance of the common ground from each of the self-impedances and the mutual impedances.

3. The impedance measurement method according to claim 1,
wherein the circuit is designed so that the circuit suppresses the interference or the coupling between at least one pair of the plurality of the power supply ports.

4. The impedance measurement method according to claim 1,
wherein the retrieving the minimum value comprises:
retrieving the minimum value among the plurality of the mutual impedances in a predetermined frequency range; and
choosing the minimum value as the approximate value for the impedance of the common ground.

5. The impedance measurement method according to claim 1,
wherein the obtaining the plurality of the self-impedances and the plurality of the mutual impedances comprises:
measuring an S-parameter data for the plurality of the power supply ports; and
converting the S-parameter data into Z-parameter data in order to obtain the plurality of the self-impedances and the plurality of the mutual impedances.

6. The impedance measurement method according to claim 1,
wherein the obtaining the plurality of the self-impedances and the plurality of the mutual impedances comprises:
calculating an S-parameter data for the plurality of the power supply ports in the circuit by making a simulation; and
converting the S-parameter data into Z-parameter data in order to obtain the plurality of the self-impedances and the plurality of the mutual impedances.

7. The impedance measurement method according to claim 1, further comprising:
generating equivalent circuit model parameters for the circuit based on the approximate value for the impedance of the common ground and the plurality of the power supply impedances.

8. An impedance measurement device comprising:
an impedance acquisition unit to acquire a plurality of self-impedances and a plurality of mutual impedances in a circuit including a plurality of power supply ports and a common ground shared by the plurality of the power supply ports;
a minimum impedance retrieval unit to find an approximate value for an impedance of the common ground at a specified accuracy based on the plurality of the mutual impedances; and
an impedance calculation unit to calculate a plurality of power supply impedances for the power supply ports not including the impedance of the common ground, based on the approximate value for the impedance of the common ground, the plurality of the self-impedances, and the plurality of the mutual impedances.

9. The impedance measurement device according to claim 8,
wherein the minimum retrieval unit retrieves a minimum value among the plurality of the mutual impedances as the approximate value for the impedance of the common ground.

10. The impedance measurement device according to claim 8,
wherein the impedance acquisition unit comprises:
a measurement unit to measure an S-parameter data for the plurality of the power supply ports; and
a matrix conversion unit that converts the S-parameter data into Z-parameter data in order to obtain the plurality of the self-impedances and the plurality of the mutual impedances.

11. The impedance measurement device according to claim 10,
wherein the impedance calculation unit calculates each of the power supply impedances $Z^{VDD}_{ij}$ by subtracting the approximate value for the impedance of the common ground $Z^{GND}$ from each of the self-impedances and the mutual impedances $Z^{loop}_{ij}$ according to the following equation:

$$Z^{VDD}_{ij} = Z^{loop}_{ij} - Z^{GND}.$$

12. The impedance measurement device according to claim 8,
wherein the impedance acquisition unit comprises:
a simulation unit to calculate an S-parameter data for the plurality of the power supply ports in the circuit by making a simulation; and
a matrix conversion unit that converts the S-parameter data into Z-parameter data in order to obtain the plurality of the self-impedances and the plurality of the mutual impedances.

13. The impedance measurement device according to claim 12,
wherein the impedance calculation unit calculates each of the power supply impedances $Z^{VDD}_{ij}$ by subtracting the approximate value for the impedance of the common ground $Z^{GND}$ from each of the self-impedances and the mutual impedances $Z^{loop}_{ij}$ according to the following equation:

$$Z^{VDD}_{ij} = Z^{loop}_{ij} - Z^{GND}.$$

14. The impedance measurement device according to claim 8,
wherein the circuit is designed so that the circuit suppresses the interference or the coupling between at least one pair in the plurality of the power supply ports.

15. The impedance measurement device according to claim 8, further comprising:
an equivalent circuit output unit to generate equivalent circuit parameters for the circuit based on the approximate value for the impedance of the common ground and the plurality of the power supply impedances.

* * * * *